(12) United States Patent
Hong et al.

(10) Patent No.: US 8,656,859 B2
(45) Date of Patent: Feb. 25, 2014

(54) MASK AND MASK ASSEMBLY HAVING THE SAME

(75) Inventors: Jae-Min Hong, Yongin (KR); Kyung-Han Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/039,035

(22) Filed: Mar. 2, 2011

(65) Prior Publication Data

US 2011/0229633 A1  Sep. 22, 2011

(30) Foreign Application Priority Data

Mar. 17, 2010  (KR) ........................ 10-2010-0023898

(51) Int. Cl.
*B05C 11/00* (2006.01)
*C23C 16/00* (2006.01)

(52) U.S. Cl.
USPC .......................... 118/504; 118/720; 118/715

(58) Field of Classification Search
None
See application file for complete search history.

(56) References Cited

U.S. PATENT DOCUMENTS

| | | | | |
|---|---|---|---|---|
| 5,234,780 A * | 8/1993 | Nitayama et al. | | 430/5 |
| 5,968,686 A * | 10/1999 | Yamada et al. | | 430/5 |
| 6,858,086 B2 * | 2/2005 | Kang | | 118/720 |
| 6,893,709 B2 * | 5/2005 | Kitazume | | 428/192 |
| 7,572,338 B2 * | 8/2009 | Kim et al. | | 118/720 |
| 7,704,326 B2 * | 4/2010 | Hagiwara et al. | | 118/720 |
| 7,802,537 B2 * | 9/2010 | Kang | | 118/504 |
| 7,837,528 B2 * | 11/2010 | Shigemura et al. | | 445/24 |
| 8,286,579 B2 * | 10/2012 | Sung et al. | | 118/504 |
| 2001/0004469 A1 * | 6/2001 | Himeshima et al. | | 427/66 |
| 2004/0104197 A1 * | 6/2004 | Shigemura et al. | | 216/20 |
| 2005/0264177 A1 * | 12/2005 | Chung et al. | | 313/503 |
| 2006/0011136 A1 * | 1/2006 | Yamazaki et al. | | 118/719 |
| 2006/0103289 A1 * | 5/2006 | Kim et al. | | 313/402 |
| 2008/0018236 A1 * | 1/2008 | Arai et al. | | 313/504 |
| 2009/0137180 A1 * | 5/2009 | Sung et al. | | 445/60 |
| 2010/0055810 A1 * | 3/2010 | Sung et al. | | 438/22 |
| 2010/0192856 A1 * | 8/2010 | Sung et al. | | 118/721 |
| 2010/0267227 A1 * | 10/2010 | Ko et al. | | 438/597 |
| 2011/0067630 A1 * | 3/2011 | Ko et al. | | 118/721 |

FOREIGN PATENT DOCUMENTS

| | | |
|---|---|---|
| CN | 1722918 A | 1/2006 |
| JP | 2004-055231 A | 2/2004 |
| JP | 2004-185832 | 7/2004 |
| JP | 2005-302457 | 10/2005 |
| JP | 2006-032342 A | 2/2006 |
| JP | 2008-208426 | 9/2008 |
| JP | 2009-074160 A | 4/2009 |
| KR | 10-2003-0021716 A | 3/2003 |

(Continued)

*Primary Examiner* — Dah-Wei Yuan
*Assistant Examiner* — Jethro Pence
(74) *Attorney, Agent, or Firm* — Christie, Parker & Hale, LLP

(57) ABSTRACT

A mask assembly includes a frame including an opening part; and unit masks that are disposed on the opening part and having both ends of each of the unit masks supported by the frame in the state where tensile force is applied in one direction, each of the unit masks including: pattern opening parts disposed in the one direction; and a first groove disposed adjacent to the pattern opening parts and between the pattern opening parts and an edge of the unit mask, and formed to be depressed from a surface of the unit mask.

22 Claims, 12 Drawing Sheets
(3 of 12 Drawing Sheet(s) Filed in Color)

(56) References Cited

FOREIGN PATENT DOCUMENTS

| KR | 10-2003-0093959 | | 12/2003 |
|----|-----------------|---|---------|
| KR | 10-2004-0054937 | A | 6/2004 |
| KR | 10-2005-0083422 | | 8/2005 |
| KR | 10-2006-0100537 | | 9/2006 |
| KR | 10-2008-0011571 | | 2/2008 |

* cited by examiner

MASK AND MASK ASSEMBLY HAVING THE SAME

CROSS-REFERENCE TO RELATED APPLICATION

This application claims the benefit of Korean Patent Application No. 10-2010-0023898, filed Mar. 17, 2010 in the Korean Intellectual Property Office, the disclosure of which is incorporated herein by reference.

BACKGROUND

1. Field

The described technology relates generally to a mask. More particularly, the described technology relates generally to a mask assembly including a frame supporting a plurality of unit masks.

2. Description of the Related Art

Examples of a flat panel display include an organic light emitting display, a liquid crystal display, a plasma display panel, etc. In order to manufacture the organic light emitting display, an electrode having specific patterns, an organic emission layer, etc. should be formed. The method for forming the electrode and the organic emission layer, etc. can be applied to a deposition method using a mask assembly.

More specifically, the organic light emitting display includes pixels and each includes an organic light emitting diode. The pixels are a basic unit for displaying images. The pixels are on a substrate and arrayed in a matrix form. The organic light emitting diode has an anode, a first electrode and a cathode, and a second electrode sequentially formed. Organic emission layers are included between the anode and cathode. Each layer emits light (such as red, green, and blue, etc.) for each pixel. Organic materials forming the organic emission layer are very vulnerable to moisture and oxygen, etc, such that they should be thoroughly isolated from moisture during a process of forming the organic emission layer and after forming the organic emission layer. Therefore, it is difficult to perform patterning using a general photolithography process. As such, the organic emission layer and the second electrode, etc. are formed using a mask. The mask has a pattern opening part for penetrating deposition materials only through a portion corresponding to each pattern formed.

Recently there has been used a mask assembly including a frame including an opening part and a plurality of unit masks in a band shape whose both ends are fixed to the frame, corresponding to the opening part. The mask assembly in the related art is fixed to the frame by applying tensile force to the unit mask. Thus, the shape of the pattern opening part formed in the unit mask may be deformed due to tensile force applied to the unit mask.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a mask according to aspects of the invention that suppresses deformation of a pattern opening part formed in a unit mask due to tensile force applied to the unit mask and a mask assembly having the same.

According to an exemplary embodiment, a mask assembly includes: a frame including an opening part; and unit masks disposed on the opening part and having both ends of each of the masks supported by the frame in the state where tensile force is applied in one direction, each of the unit masks including: pattern opening parts disposed in the one direction; and a first groove disposed adjacent to the pattern opening parts and between the pattern opening parts and an edge of the unit mask, and formed to be depressed from a surface of the unit mask.

According to an aspect of the invention, the first groove may have a deformed width on the surface of the unit mask according to the strength of the tensile force applied to the pattern opening part adjacent to the first groove.

According to an aspect of the invention, the first groove may have a semi-circular shape on the surface of the unit mask.

The unit mask may further include a second groove disposed adjacent to the pattern opening part and between the neighboring pattern opening parts, and formed to be depressed from the surface of the unit mask.

According to an aspect of the invention, the second groove may have a deformed width on the surface of the unit mask according to the strength of the tensile force applied to the pattern opening part adjacent to the second groove.

According to an aspect of the invention, the second groove may have a semi-circular shape or a cone shape on the surface of the unit mask.

According to an aspect of the invention, the first groove is plural in number, and wherein the unit mask may further includes a third groove disposed between the neighboring first grooves and formed to be depressed from the surface of the unit mask.

According to an aspect of the invention, the third groove may have a polygonal shape.

According to an aspect of the invention, the unit mask may further include a dummy pattern disposed between a pattern opening part positioned at an outermost side of the plurality of pattern opening parts disposed in the one direction and the ends of the unit mask.

According to an aspect of the invention, the dummy pattern may have a deformed width on the surface of the unit mask according to the strength of the tensile force applied to the pattern opening part adjacent to the dummy pattern.

According to an aspect of the invention, the dummy pattern may penetrate through the unit mask.

According to an aspect of the invention, the dummy pattern may be formed to be depressed from the surface of the unit mask.

According to an aspect of the invention, the dummy pattern may corresponds to the frame.

According to an aspect of the invention, the pattern opening part may have a stripe or dot type.

According to another exemplary embodiment, a unit mask having both first and second ends, which oppose each other, supported by a frame in the state where tensile force is applied in one direction includes: a unit mask main body part having a band shape extending along the one direction; pattern opening parts disposed in the one direction; and a first groove disposed adjacent to the pattern opening part and between the pattern opening part and an edge of the unit mask main body part, and formed to be depressed from a surface of the unit mask main body part.

According to an aspect of the invention, the first groove may have a deformed width on the surface of the unit mask main body part according to the strength of the tensile force applied to one of the pattern opening parts adjacent to the first groove.

According to an aspect of the invention, the unit mask may further include a second groove disposed adjacent to the pattern opening parts and between two adjacent ones of the neighboring pattern opening parts, and formed to be depressed from the surface of the unit mask main body part.

According to an aspect of the invention, the second groove may have a deformed width on the surface of the unit mask main body part according to the strength of the tensile force applied to one of the pattern opening parts adjacent to the second groove.

According to an aspect of the invention, the unit mask further includes a third groove disposed between adjacent ones of the first grooves and formed to be depressed from the surface of the unit mask main body part, wherein the first groove is plural in number.

According to an aspect of the invention, the unit mask may further include a dummy pattern disposed between a pattern opening part positioned at an outermost side of the plurality of pattern opening parts and the ends of the unit mask main body part.

According to an aspect of the invention, the dummy pattern may have a deformed width on the surface of the unit mask main body part according to the strength of the tensile force applied to one of the pattern opening parts neighboring to the dummy pattern.

According to an aspect of the invention, the pattern opening part may have a stripe or dot type.

According to an embodiment, the mask that suppresses the deformation of the pattern opening part formed in a unit mask due to tensile force applied to the unit mask, and the mask assembly having the same are provided.

Additional aspects and/or advantages of the invention will be set forth in part in the description which follows and, in part, will be obvious from the description, or may be learned by practice of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee. These and/or other aspects and advantages of the invention will become apparent and more readily appreciated from the following description of the embodiments, taken in conjunction with the accompanying drawings of which:

FIGS. 7A to 9 are drawings for explaining an experiment confirming that deformation of a pattern opening part is suppressed due to the dispersion of tensile force applied to a pattern opening part of each unit mask included in each mask assembly according to each exemplary embodiment;

DETAILED DESCRIPTION

Figure 1:
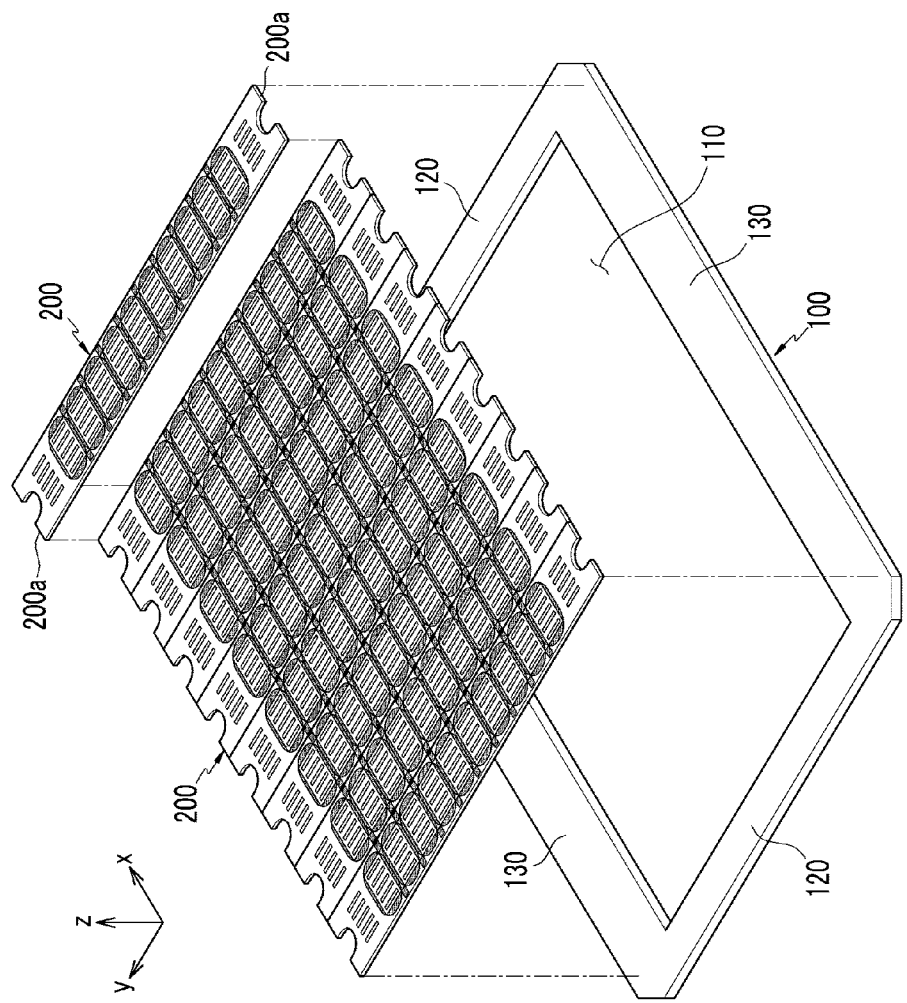
FIG. 1 is an exploded perspective view showing a mask assembly according to an exemplary embodiment.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
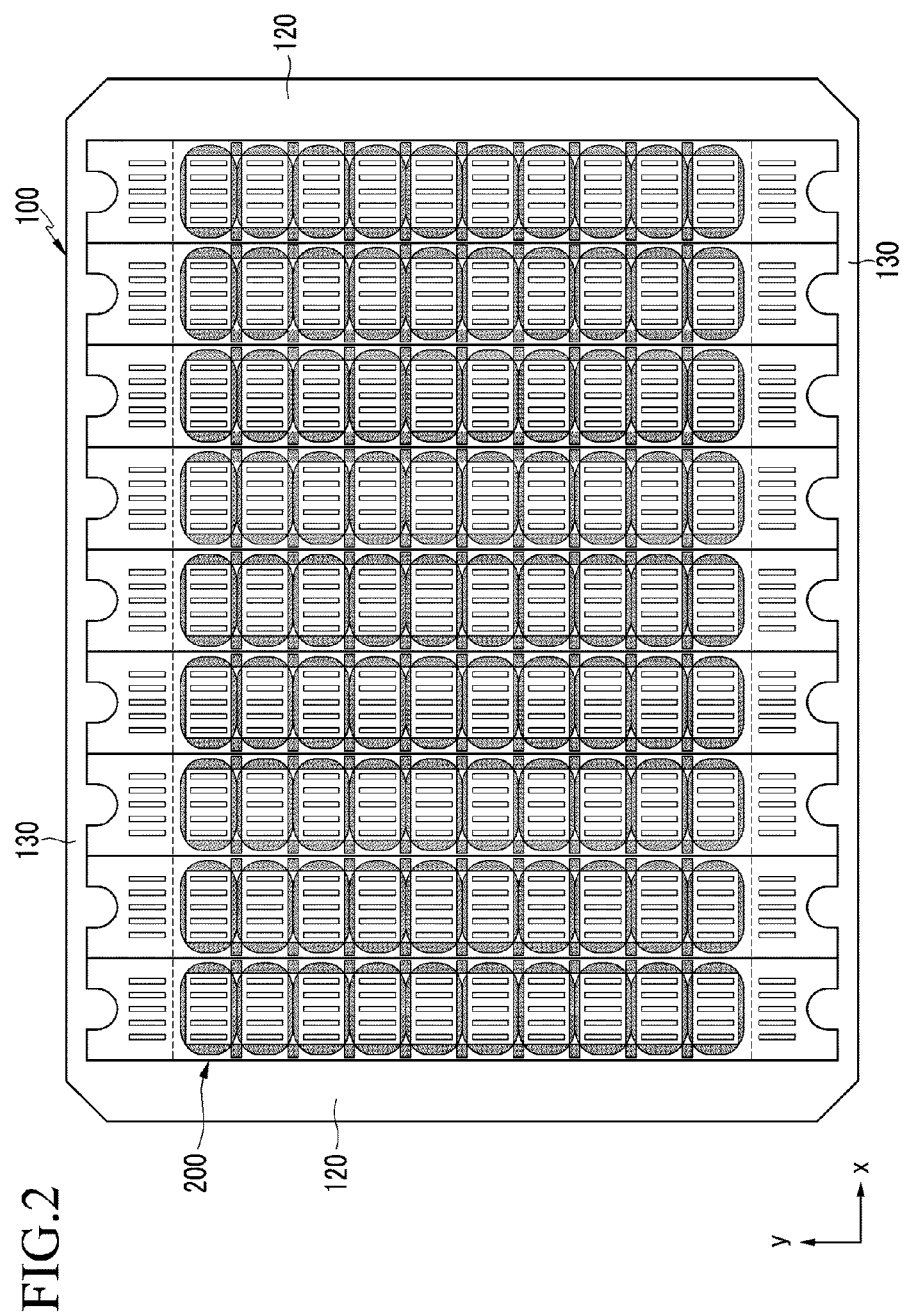
FIG. 2 is a plan view showing a mask assembly according to the exemplary embodiment of FIG. 1.

Hereinafter, a mask assembly according to an exemplary embodiment will be described with reference to FIGS. 1 to 4. FIG. 1 is an exploded perspective view showing the mask assembly. FIG. 2 is a plan view showing a mask assembly. As shown in FIGS. 1 and 2, the mask includes a frame 100 and a plurality of unit masks 200.

The frame 100 fixes and supports both ends of each of the plurality of unit masks 200, and includes an opening part 110 that exposes the unit mask 200. The frame 100 further includes a pair of first supporting parts 120 that face each other along an elongation direction of a supporting stick (i.e., that is, a first direction x) with the opening part 110 therebetween. The frame 100 also has a pair of second supporting part 130 that faces each other along a second direction y intersecting with the first direction x, with the opening part 110 therebetween. The second supporting part 130 supports both ends 200a of the unit mask 200 by a fixing method, such as welding, etc., in the state where a tensile force is applied to the unit mask 200 in the second direction y.

In the frame 100, the first supporting part 120 forms a short side of the frame 100 having a quadrangle shape. The second supporting part 130 forms a long side of the frame 100. However, it is understood that the frame of the mask assembly can have the first supporting part 120 and the second supporting part 130 to have the substantially same length in other aspects. Further, the frame of the mask assembly according another embodiment may be formed in a polygonal or circular shape.

The unit masks 200 are fixed to the frame 100 so as to be supported by a frame 100 in the state where the tensile force is applied to the unit masks 200. Since compression force is applied to the frame 100 along the second direction y (the extending direction of the unit masks 200) due to the tensile force applied to the unit mask 200, the frame 100 is made of a metal material such as stainless steel having large rigidity, etc. Thus, the deformation of the frame does not occur due to compression force of the unit mask 200.

The unit masks 200 have a band shape extending in the second direction y. Both ends 200a of each unit mask 200 are supported by the frame 100 in the state where the tensile force is applied in the second direction y. The plurality of unit masks 200 are disposed and fixed to the frame 100 along the first direction x.

Figure 3:
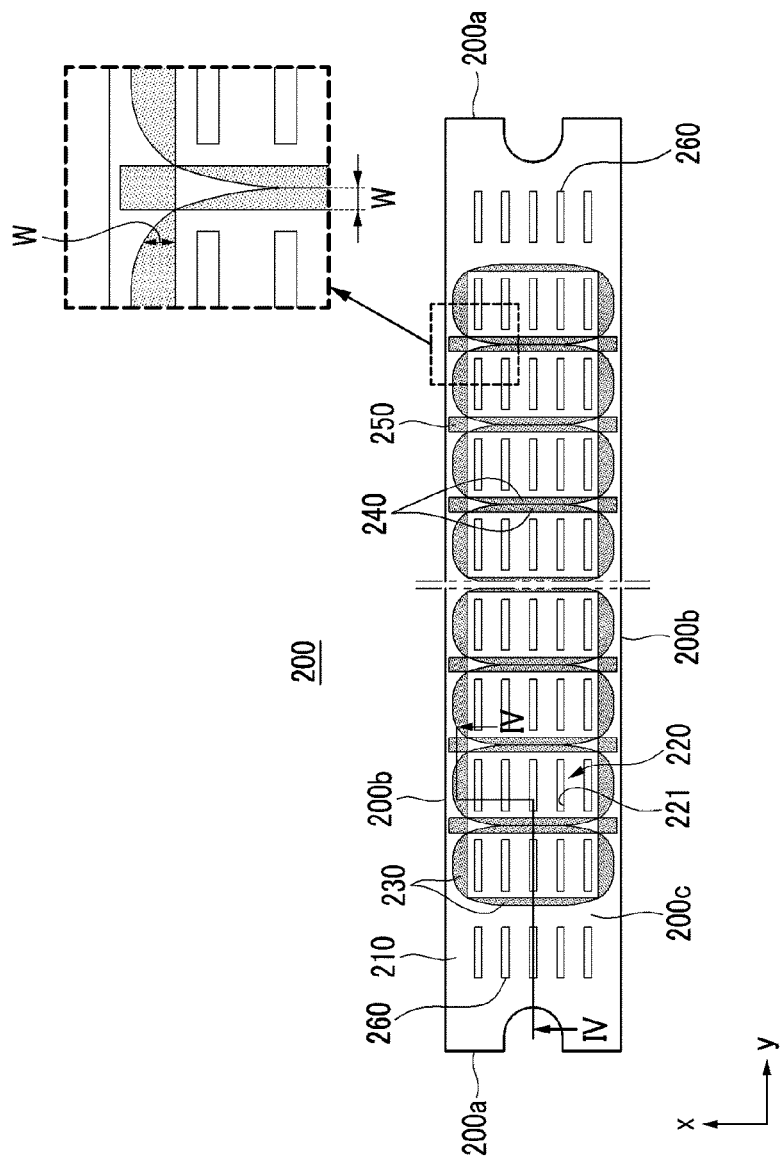
FIG. 3 is a plan view showing a unit mask included in the mask assembly according to the an exemplary embodiment of FIG. 1.
Figure 4:
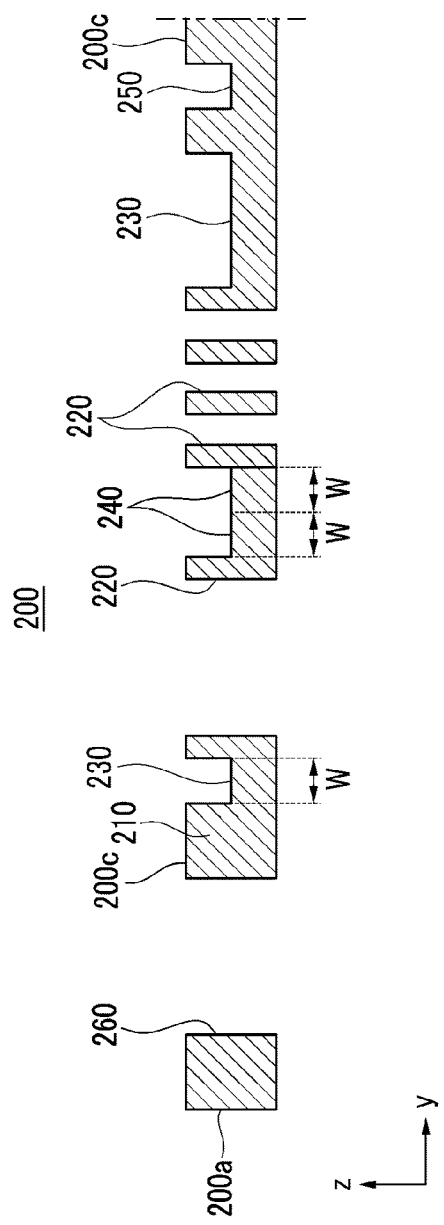
FIG. 4 is a cross-sectional view taken along line IV-IV of FIG. 3.

Hereinafter, the unit mask 200 included in the mask assembly will be described with reference to FIGS. 2 to 4. FIG. 3 is a plan view showing a unit mask included in the mask 200 assembly. FIG. 4 is a cross-sectional view taken along line IV-IV of FIG. 3.

As shown in FIGS. 3 and 4, the unit mask 200 includes a unit mask main body part 210, pattern opening parts 220, a first groove 230, a second groove 240, a third groove 250, and a dummy pattern 260.

The unit mask main body part 210 has a band shape extending along the second direction y and is disposed on the opening part 110 of the frame 100 and is supported by frame 100. The unit mask main body part 210 is provided with the plurality of pattern opening parts 220 along the second direction y.

The plurality of pattern opening parts 220 are disposed in one unit mask 200 along the second direction y. The pattern opening part 220 may correspond to one organic light emitting display. In this case, patterns forming several organic light emitting displays can be simultaneously formed on a mother substrate, on which the organic light emitting display will be manufactured, by a single process through the unit mask 200. In other words, the pattern opening part 220 is disposed on the unit mask 200, corresponding to the deposition region of the patterns forming the organic light emitting display. The pattern opening part 220 has an open pattern which penetrates through the unit mask 200 so that the patterns forming the organic light emitting display can be formed on the mother substrate through the pattern opening part 220. The shape of the pattern opening part 220 has a stripe type, and the first groove 230 is positioned near each pattern opening part 220.

Each first groove 230 is positioned between the pattern opening part 220 and an edge 200b of the unit mask 200 and is formed to be depressed from the surface 200c of the unit mask 200. The first grooves 230 are disposed along the second direction y, corresponding to each of the plurality of pattern opening parts 220 disposed along the second direction y. The first grooves 230 are disposed between the pattern opening part 220 positioned at the outermost side in the second direction y and the edge 200b of the unit mask 200. The first grooves 230 are adjacent to the pattern opening part 220 positioned at the outermost side in the second direction y.

The first groove 230 has a semi-circular shape on the surface 200c of the unit mask 200. The first groove 230 has the semi-circular shape, such that it has a deformed width W on the surface 200c of the unit mask 200. The deformed width W of the first groove 230 is deformed according to the strength of tensile force applied to the pattern opening part 220 neighboring to the first groove 230 by a tensile force applied to the unit mask 200. As shown in FIG. 3, when the pattern opening part 220 has a quadrangular shape on the surface 200c of the unit mask 200, the width W of the first groove 230 corresponding to one side 221 of the pattern opening part 220 is gradually narrowed from a portion corresponding to the central portion of one side 221 of the pattern opening part 220 to the outer portion of one side 221 of the pattern opening part 220. In other words, in the entire portion of one side 221 of the pattern opening part 220, the width W of the first groove 230 corresponding to one portion to which stronger tensile force is applied than other portions is formed to be wider than the width W of the first groove 230 corresponding to other portions of the pattern opening part 220. In this configuration, the first groove 230 has the deformed width W on the surface 200c of the unit mask 200 according to the strength of the tensile force applied to the pattern opening part 220, thereby dispersing the tensile force applied to the pattern opening part 220. Further, the tensile force applied to the pattern opening part 220 is dispersed by the first groove 230, such that the deformation of the pattern opening part 220 by the tensile force applied to the unit mask 200 is suppressed.

The fact that the deformation of the pattern opening part 220 is suppressed due to the dispersion of the tensile force applied to the pattern opening part 220 by the first groove 230 having the deformed width W is confirmed through the experiment. This experiment will be described below.

In the first groove 230 of the unit mask 200, the width W corresponding to one portion to which a stronger tensile force is applied than other portions in the entire portion of one side 221 of the pattern opening part 220 is formed to be wider than the width W corresponding to other portions of one side 221. However, in other embodiments, the width W corresponding to one portion to which stronger tensile force is applied than other portions in the entire portion of one side 221 of the pattern opening part 220 is formed to be narrower than the width W corresponding to other portions of one side 221.

The second groove 240 is positioned near the pattern opening part 220 between neighboring pattern opening parts 220 of the plurality of pattern opening parts 220 disposed along the second direction y and is formed to be depressed from the surface 200c of the unit mask 200. The second groove 240 has a semi-circular shape on the surface 200c of the unit mask 200. The second groove 240 has a semi-circular shape, thereby having a deformed width W on the surface 200c of the unit mask 200. The deformed width W of the second groove 240 is deformed according to the strength of tensile force applied to the pattern opening part 220 neighboring to the second groove 240 by tensile force applied to the unit mask 200. As shown in FIG. 3, when the pattern opening part 220 has a quadrangular shape on the surface 200c of the unit mask 200, the width W of the second groove 240 corresponding to one side 221 of the pattern opening part 220 is gradually narrowed from a portion corresponding to the central portion of one side 221 of the pattern opening part 220 to the outer portion of one side 221 of the pattern opening part 220.

In other words, in the entire portion of one side 221 of the pattern opening part 220, the width W of the second groove 240 corresponding to one portion to which stronger tensile force is applied than other portions is formed to be wider than the width W of the second groove 240 corresponding to other portions of the pattern opening part 220.

In this configuration, the second groove 240 has the deformed width W on the surface 200c of the unit mask 200 according to the strength of the tensile force applied to the pattern opening part 220, thereby dispersing the tensile force applied to the pattern opening part 220.

Further, the tensile force applied to the pattern opening part 220 is dispersed by the second groove 240, such that the deformation of the pattern opening part 220 by the tensile force applied to the unit mask 200 is suppressed.

The fact that the deformation of the pattern opening part 220 is suppressed due to the dispersion of the tensile force applied to the pattern opening part 220 by the second groove 240 having the deformed width W is confirmed through the experiment. This experiment will be described below.

In the second groove 240 of the unit mask 200, the width W corresponding to one portion to which stronger tensile force is applied than other portions in the entire portion of one side 221 of the pattern opening part 220 is formed to be wider than the width W corresponding to other portions of one side 221. However, the width W corresponding to one portion to which stronger tensile force is applied than other portions in the entire portion of one side 221 of the pattern opening part 220 is formed to be narrower than the width W corresponding to other portions of one side 221 in other embodiments.

Further, according to the shown embodiment, two second grooves 240 are positioned between an adjacent pair of the opening parts 220. However, according to another embodiment, one or three second grooves 240 may be positioned between the neighboring pattern opening parts 220.

The third groove 250 is positioned between adjacent pairs of the first grooves 230 and is formed to be depressed from the surface 200c of the unit mask 200. The third groove 250 has a polygonal shape and/or a quadrangular shape on the surface 200c of the unit mask 200. The third groove 250 disperses the tensile force applied to the pattern opening part 220, such that the deformation of the pattern opening part 220 by the tensile force applied to the unit mask 200 is suppressed.

The fact that the deformation of the pattern opening part 220 is suppressed due to the dispersion of the tensile force applied to the pattern opening part 220 by the third groove 250 is confirmed through the experiment. This experiment will be described below.

Although the third groove 250 of the unit mask 200 included in the probe assembly according to the shown exemplary embodiment has a quadrangular shape on the surface of the unit mask 200, the third groove 250 according to another embodiment may have a triangle, a circle, or a polygon such as pentagon, etc.

Further, according to the shown exemplary embodiment, one third groove 250 is disposed between the neighboring first grooves 230. However, according to another embodiment, a plurality of third grooves 250 of the unit mask 200 included in the probe assembly may be disposed between the neighboring first grooves 230.

A dummy pattern 260 is disposed between the pattern opening part 220 disposed at the outermost side in the second direction y and the end 200a of the unit mask 200. The dummy pattern 260 and performs a role of dispersing the tensile force applied to the pattern opening part 220 by the tensile force applied to the unit mask 200.

The dummy pattern 260 disperses the tensile force applied to the pattern opening part 220, thereby suppressing the deformation of the pattern opening part 220 by the tensile force applied to the unit mask 200. The dummy pattern 260 is disposed on the main body part 210 at a location corresponding to the frame 100. As described above, the dummy pattern 260 is disposed on the frame 100 to prevent the deposition material from depositing on the mother substrate through the dummy pattern 260 during the deposition process using the probe assembly. The dummy pattern 260 has a stripe type like the pattern opening part 220.

The fact that the deformation of the pattern opening part 220 is suppressed due to the dispersion of the tensile force applied to the pattern opening part 220 by the dummy pattern 260 is confirmed through the experiment. This experiment will be described below.

In this configuration, the unit mask 200 includes the first groove 230, the second groove 240, the third groove 250, and the dummy pattern 260 that disperse the tensile force applied to the pattern opening part 220, thereby suppressing the deformation of the pattern opening part 220 by the tensile force applied by the unit mask 220.

Figure 5:
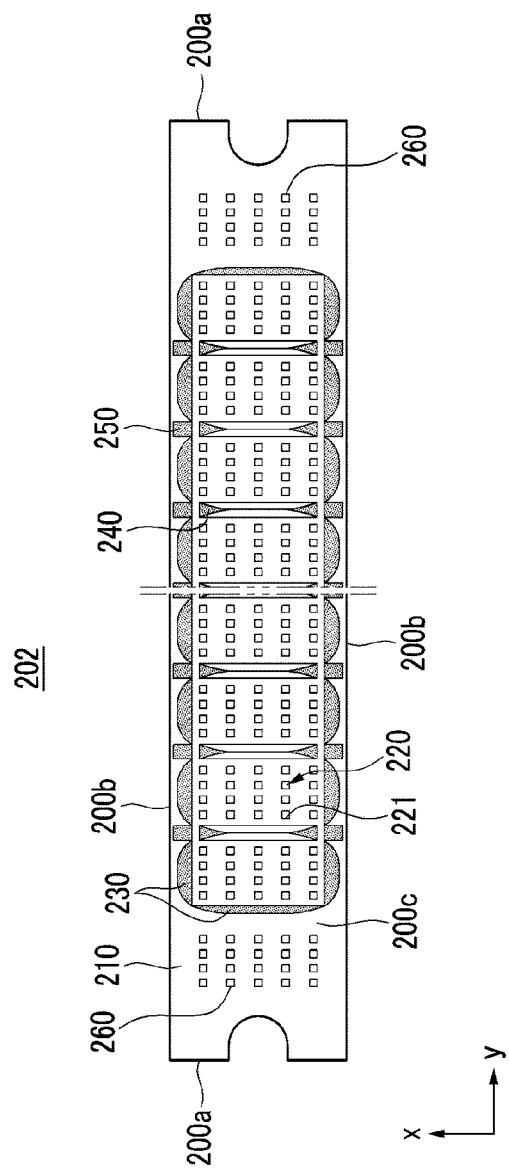
FIG. 5 is a plan view showing a unit mask included in a probe assembly according to an exemplary embodiment.

Hereinafter, the unit mask 202 included in the probe assembly according to an exemplary embodiment will be described with reference to FIG. 5. FIG. 5 is a plan view showing the unit mask 202.

As shown in FIG. 5, the unit mask 202 includes the unit mask main body part 210, the pattern opening part 220, the first groove 230, the second groove 240, the third groove 250, and the dummy pattern 260. The second groove 240 is disposed near the pattern opening part 220 between the neighboring pattern opening parts 220 in the plurality of pattern opening parts 220 disposed along the second direction y and is formed to be depressed from the surface 200c of the unit mask 202.

The second groove 240 has a cone shape on the surface 200c of the unit mask 202. Specifically, the second groove 240 has the cone shape such that it has the deformed width W on the surface 200c of the unit mask 202. The deformed width W of the second groove 240 is deformed according to the strength of tensile force applied to the pattern opening part 220 neighboring to the second groove 240 by the tensile force applied to the unit mask 200. As shown in FIG. 5, when the pattern opening part 220 has a quadrangular shape on the surface 200c of the unit mask 202, the width W of the second groove 240 corresponding to one side 221 of the pattern opening part 220 is gradually widened from a portion corresponding to the central portion of one side 221 of the pattern opening part 220 to the outer portion of one side 221 of the pattern opening part 220. In other words, in the entire portion of one side 221 of the pattern opening part 220, the width W of the second groove 240 corresponding to one portion to which stronger tensile force is applied than other portions is formed to be narrower than the width W of the second groove 240 corresponding to other portions of the pattern opening part 220. In this configuration, the second groove 240 has the deformed width W on the surface 200c of the unit mask 202 according to the strength of the tensile force applied to the pattern opening part 220, thereby dispersing the tensile force applied to the pattern opening part 220.

Further, the tensile force applied to the pattern opening part 220 is dispersed by the second groove 240, such that the deformation of the pattern opening part 220 by the tensile force applied to the unit mask 202 is suppressed. The form of the pattern opening part 220 and the dummy pattern 260 of the unit mask 202 included in the mask assembly according to the second exemplary embodiment has a dot type.

The unit mask 200,202 and the dummy pattern 160,260 included in the mask assembly according to the exemplary embodiments shown in FIGS. 1 to 5 are not limited to the shown stripe or the dot type. Therefore, the unit mask and the dummy pattern included in the mask assembly according to another embodiment may have various types.

The fact that the deformation of the pattern opening part 220 is suppressed due to the dispersion of the tensile force applied to the pattern opening part 220 by the first groove 230, the third groove 250, the dummy pattern 260, and the second groove 240 having the deformed width W pattern opening part 220 is confirmed through the experiment. This experiment will be described below.

In this configuration, the unit mask 202 includes the first groove 230, the second groove 240, the third groove 250, and the dummy pattern 260 that disperse the tensile force applied to the pattern opening part 220, thereby suppressing the deformation of the pattern opening part 220 by the tensile force applied by the unit mask 220.

Hereinafter, a unit mask 203 included in a probe assembly according to an exemplary embodiment will be described with reference to FIG. 6.

Figure 6:
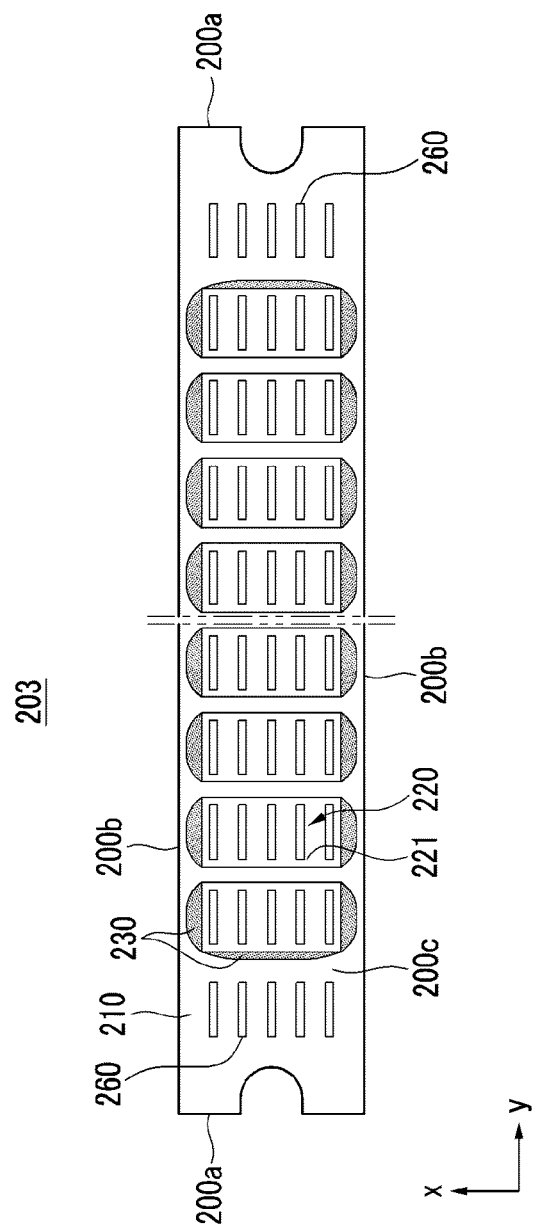
FIG. 6 is a plan view showing a unit mask included in a probe assembly according to an exemplary embodiment.

As shown in FIG. 6, the unit mask 203 includes the unit mask body part 210, the pattern opening part 220, the first groove 230, and the dummy pattern 260.

In other words, the unit mask 203 includes only the first groove 230, and does not include the second groove 240, and the third groove 250 included in the unit mask 200,202 of the foregoing embodiments shown in FIGS. 1 to 5.

In this configuration shown in FIG. 6, the fact that the deformation of the pattern opening part 220 is suppressed due to the dispersion of the tensile force applied to the pattern opening part 220 by the first groove 230 and the dummy pattern 260 is confirmed through the experiment. This experiment will be described below.

In this configuration shown in FIG. 6, the unit mask 203 includes the first groove 230 and the dummy pattern 260 that disperse the tensile force applied to the pattern opening part 220, thereby suppressing the deformation of the pattern opening part 220 by the tensile force applied by the unit mask 220.

Hereinafter, the experiment confirming that the deformation of the pattern opening part 220 is suppressed due to the dispersion of the tensile force applied to each pattern opening part 220 of each unit mask 200, 202, and 203 included in each mask assembly according to each of the first, second, and third embodiments will be described with reference to FIGS. 7A to 9.

FIGS. 7A to 9 are drawings for explaining the experiment confirming that the deformation of the pattern opening part is suppressed due to the dispersion of tensile force applied to the pattern opening part of each unit mask included in each mask assembly according to each exemplary embodiment.

Figures 7A, 7B:
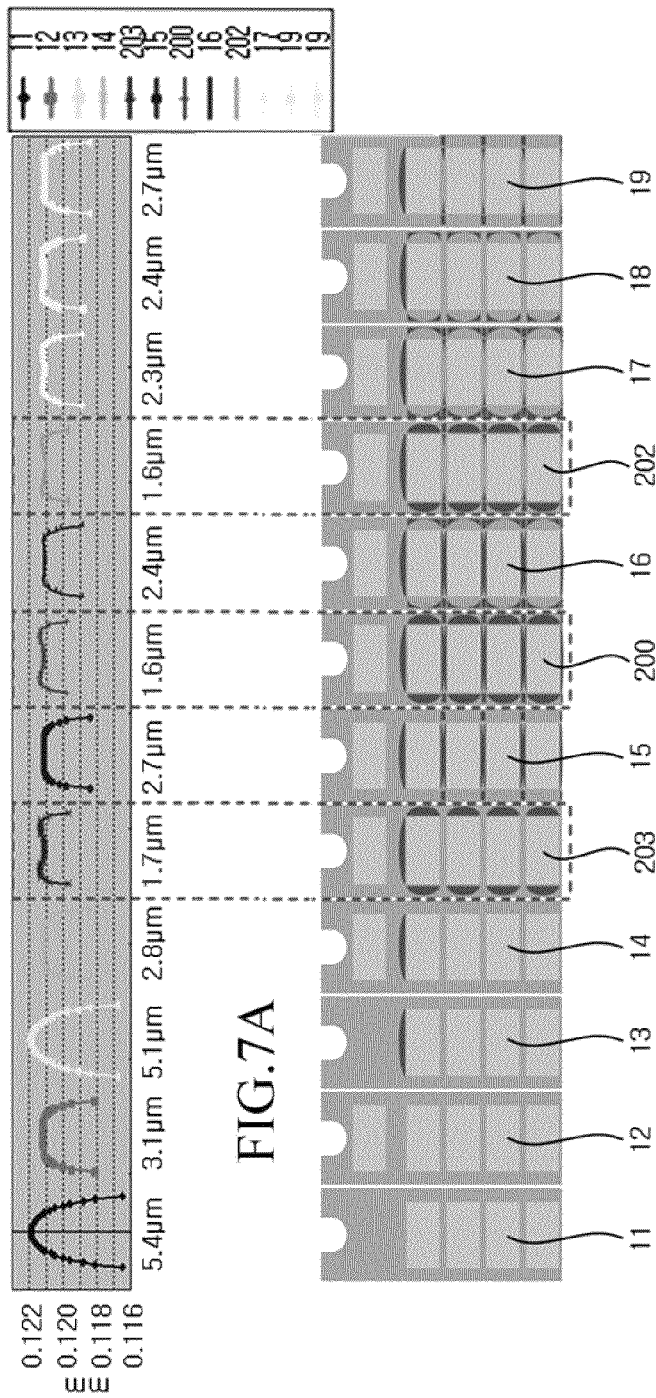

First, FIG. 7A is a plan view showing the unit masks 200, 202, and 203 included in each mask assembly according to each of the embodiments shown in FIGS. 1 to 6. FIG. 7A also shows unit masks 11 to 19 according to each comparison examples 1 to 9. As shown, unit mask 11 does not include a dummy pattern or any of the first to third grooves; unit mask 12 has the dummy pattern but none of the first through third grooves; unit mask 13 has a single first groove on one side, but has no dummy pattern and no second and third grooves; unit mask 14 has a single first groove on one side and a dummy pattern, but no second and third grooves; unit mask 15 has a single first groove on one side, a dummy pattern, and second and third grooves; unit mask 16 has a single first groove on one side, a dummy pattern, and the second and third grooves, and a raised area on the other sides where the first groove otherwise would be; unit mask 17 has a single first groove on one side, a dummy pattern, and the third groove, and a raised area on the other sides where the first groove otherwise would be; unit mask 18 has a single first groove on one side, a dummy pattern, a raised area on the other sides where the first groove otherwise would be, but not second or third grooves; and unit mask 19 has a single first groove on one side, a dummy pattern, and a third groove, but no second grooves.

FIG. 7B is a graph measuring the deformation value of the pattern opening part included in each unit mask when the unit mask is supported by the same frame in the state where the same tensile force is applied to each unit mask shown in FIG. 7A.

In the graph shown in FIG. 7B, an x-axis represents a difference of altitude of a graph showing the measured deformation value of the pattern opening part and a y-axis represents the deformation value of the pattern opening part.

As shown in FIG. 7B, the deformation values of each pattern opening part included in the unit masks 11 to 19 according to each of comparison examples 1 to 9 represents a difference of altitude of 2.3 µm (micrometer) to 5.4 µm when the same tensile force is applied to each unit mask 11 to 19. On the other hand, the deformation values of the pattern opening part 220 of the unit mask 200 according to the embodiment shown in FIGS. 1 to 4 represents a difference of altitude of 1.6 µm when tensile force is applied to the unit mask 200.

In other words, the fact that the unit mask 200 better suppresses the deformation of the pattern opening part 220 due to the dispersion of the tensile force applied to the pattern opening part 220 than the unit masks 11 to 19 according to each of the comparison examples 1 to 9 was confirmed.

Further, the deformation values of each pattern opening part included in the unit masks 11 to 19 according to each of comparison examples 1 to 9 represents a difference of altitude of 2.3 µm to 5.4 µm when the same tensile force is applied to each unit mask 11 to 19. On the other hand, the deformation values of the pattern opening part 220 of the unit mask 202 of FIG. 5 represents a difference of altitude of 1.6 µm when tensile force is applied to the unit mask 202. In other words, the fact that the unit mask 202 of FIG. 5 better suppresses the deformation of the pattern opening part 220 due to the dispersion of the tensile force applied to the pattern opening part 220 than the unit masks 11 to 19 according to each of the comparison examples 1 to 9 was confirmed.

Further, the deformation values of each pattern opening part included in the unit masks 11 to 19 according to each of comparison examples 1 to 9 represents a difference of altitude of 2.3 µm to 5.4 µm when the same tensile force is applied to each unit mask 11 to 19. On the other hand, the deformation values of the pattern opening part 220 of the unit mask 203 of FIG. 6 represents a difference of altitude of 1.7 µm when tensile force is applied to the unit mask 203.

In other words, the fact that the unit mask 203 better suppresses the deformation of the pattern opening part 220 due to the dispersion of the tensile force applied to the pattern opening part 220 than the unit masks 11 to 19 according to each of the comparison examples 1 to 9 was confirmed.

Figure 8:
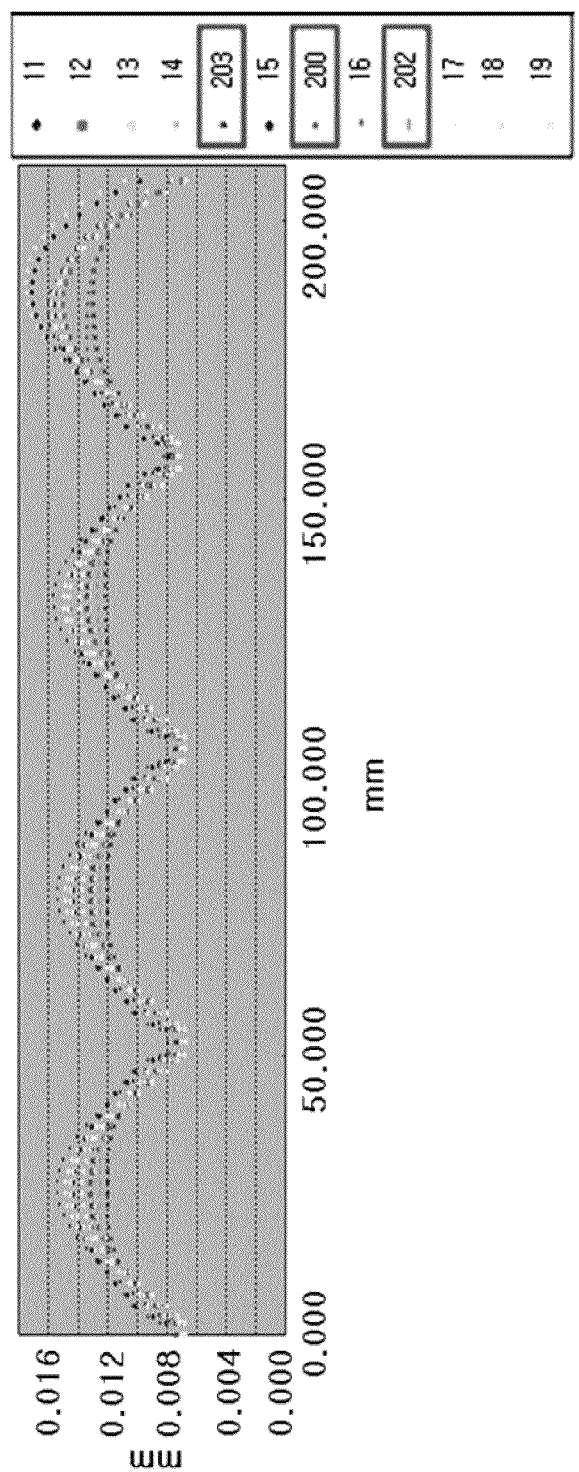

Next, FIG. 8 is a graph measuring deformation values per position of each unit mask when the unit masks 200, 202, and 203 included in each mask assembly according to the embodiments of FIGS. 1 to 6 and each unit mask 11 to 19 according to each of the comparison examples 1 to 9 are supported by the same frame in the state where the same tensile force is applied. In the graph shown in FIG. 8, an x-axis represents the positions of each of the unit masks (a length of each unit mask is set to 200 mm) and a y-axis represents the deformation values of each of the unit masks.

As shown in FIG. 8, the fact that the deformation values per the position of the unit masks 11 to 19 according to comparison examples 1 to 9 is larger than those per the positions of each of the unit masks 200, 202, and 203 when the same tensile force is applied to each unit mask 11 to 19 was confirmed.

In other words, the fact that the deformation per the position of each unit mask 200, 202, and 203 is less than the unit masks 11 to 19 according to each of the comparison examples 1 to 9 was confirmed, such that the tensile force applied to each pattern opening part 220 is dispersed and thus, that the deformation of each pattern opening part 220 is suppressed was confirmed.

Figure 9:
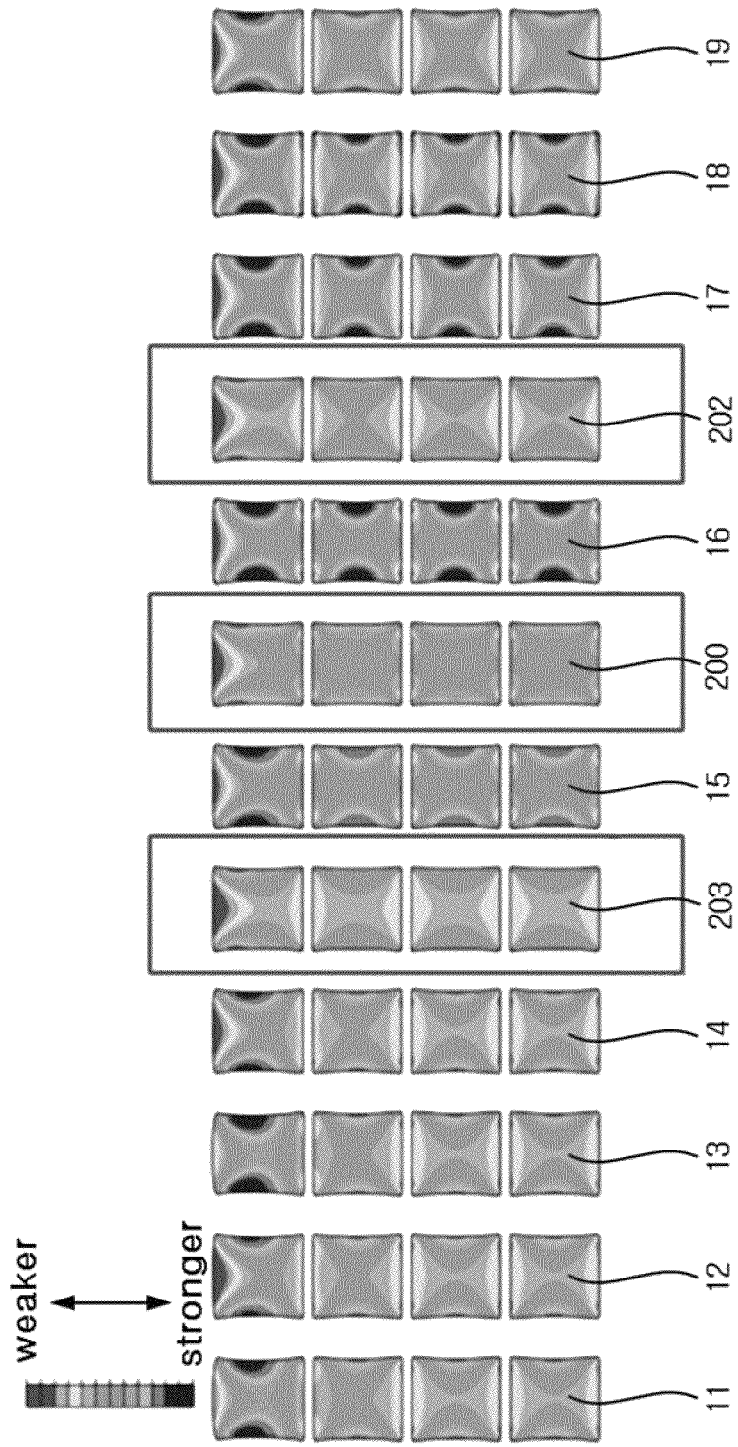

Next, FIG. 9 is a diagram showing pressure applied to the pattern opening part included in each unit mask when the unit masks 200, 202, and 203 and each unit mask 11 to 19 according to each of the comparison examples 1 to 9 are supported by the same frame in the state where the same tensile force is applied. FIG. 9 shows results derived from a simulation experiment using a SIMULIA structure available from Dassault Systemes Co. and ABAQUS, electric and heat analysis tool. The colors of FIG. 9 means that the tensile force is stronger from red color to blue color.

As shown in FIG. 9, it can be confirmed that sides of each pattern opening part included in each of the unit masks 11 to 19 according to each of the comparison examples 1 to 9 are shown by blue when the same tensile force is applied to each unit mask 11 to 19. On the other hand, it can be confirmed that sides of each pattern opening part 220 included in each unit mask 200, 202, and 203 are not shown by blue. In other words, it was confirmed that the pressure applied to each pattern opening part 220 included in each unit mask 200, 202, and 203 included in the mask assembly according to each of the first, second, and third embodiments is less than the pattern opening part of the unit masks 11 to 19 according to each of the comparison examples 1 to 9.

In other words, it was confirmed that the tensile force applied to each pattern opening part 220 included in each unit mask 200, 202, and 203 is dispersed and thus, the deformation of each pattern opening part 220 is suppressed. It was confirmed from the foregoing experiment that the tensile force applied to each pattern opening part 220 included in each unit mask 200, 202, and 203 included in the mask assembly according to each of the embodiments is dispersed and thus, the deformation of each pattern opening part 220 is suppressed.

Figure 10:
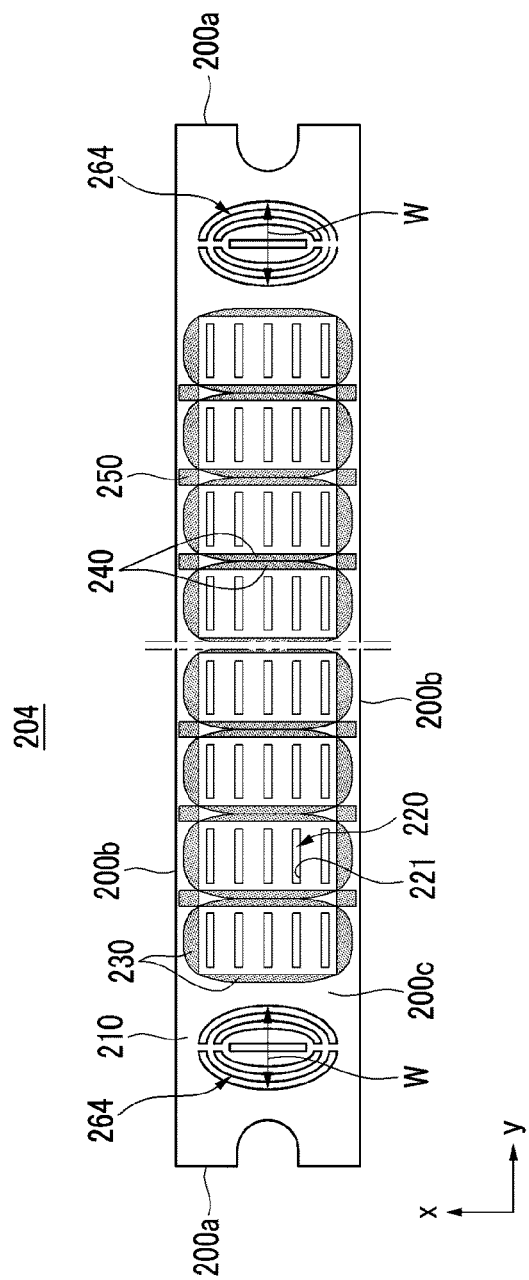
FIG. 10 is plan view showing a unit mask included in a probe assembly according to an exemplary embodiment.

A unit mask 204 included in a probe assembly according to an exemplary embodiment will now be described with reference to FIG. 10. As shown in FIG. 10, the unit mask 204 includes the unit mask main body part 210, the pattern opening part 220, the first groove 230, the second groove 240, the third groove 250, and the dummy pattern 264.

The dummy pattern 264 has a deformed width W on the surface 200c of the unit mask 204 depending on the strength of the tensile force applied to the pattern opening part 220 neighboring to the dummy pattern 264.

The dummy pattern 264 is disposed between the outermost pattern opening part 220 and the end 200a of the unit mask 204 and is formed to penetrate through the unit mask 204. The shown dummy pattern 264 has an oval shape on the surface 200c of the unit mask 204, such that it has a deformed width W on the surface 200c of the unit mask 204. The deformed width W of the dummy pattern 240 is deformed according to the strength of tensile force applied to the pattern opening part 220 neighboring to the dummy pattern 264 by tensile force applied to the unit mask 204. As shown in FIG. 10, when the pattern opening part 220 has a quadrangular shape on the surface 200c of the unit mask 204, the width W of the dummy pattern 264 corresponding to one side 221 of the pattern opening part 220 is gradually narrowed from a portion corresponding to the central portion of one side of the pattern opening part 220 to the outer portion of one side 221 of the pattern opening part 220.

In other words, in the entire portion of one side 221 of the pattern opening part 220, the width W of the dummy pattern 264 corresponding to one portion to which a stronger tensile force is applied than other portions is formed to be wider than the width W of the dummy pattern 264 corresponding to other portions of the pattern opening part 220.

In this configuration, the dummy pattern 264 has the deformed width W on the surface 200c of the unit mask 204 according to the strength of the tensile force applied to the pattern opening part 220, thereby dispersing the tensile force applied to the pattern opening part 220.

Further, the tensile force applied to the pattern opening part 220 is dispersed by the dummy pattern 264, such that the deformation of the pattern opening part 220 by the tensile force applied to the unit mask 204 is suppressed.

In the dummy pattern 264 of the unit mask 204, the width W corresponding to one portion to which a stronger tensile force is applied than other portions in the entire portion of one side 221 of the pattern opening part 220 is formed to be wider than the width W corresponding to other portions of one side 221. However, in the dummy pattern 264 of the unit mask included in the probe assembly according to another embodiments, the width W corresponding to one portion to which a stronger tensile force is applied than other portions in the entire portion of one side 221 of the pattern opening part 220 are formed to be narrower than the width W corresponding to other portions of one side 221.

A unit mask 205 included in a probe assembly according to an embodiment will now be described with reference to FIGS. 11 and 12. FIG. 12 is a cross-sectional view taken along line XII-XII of FIG. 11.

Figure 11:
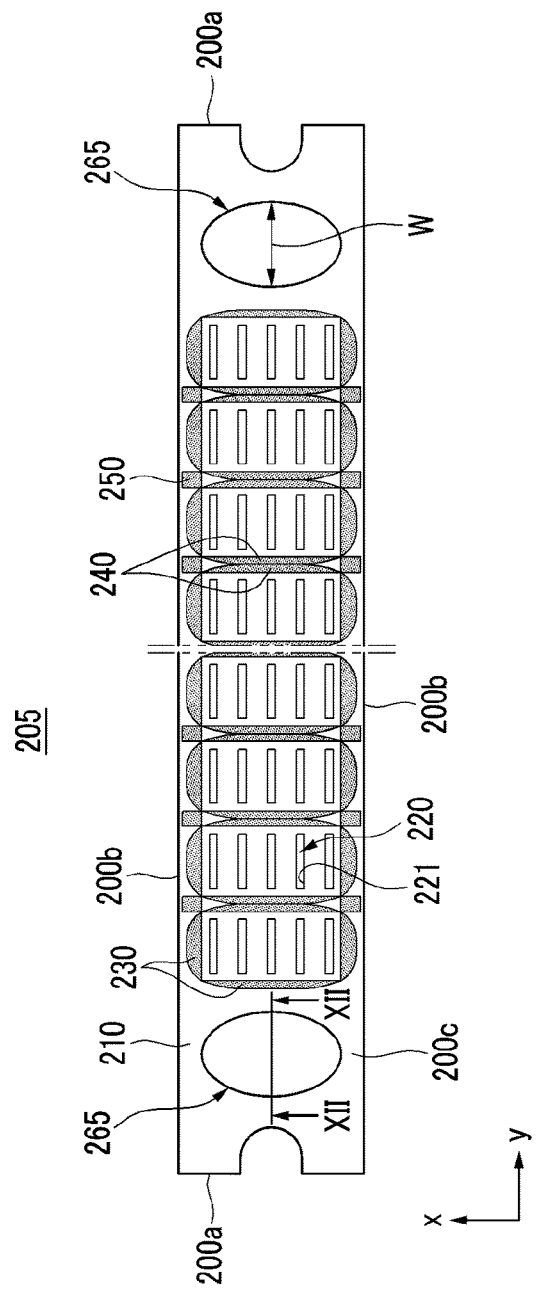
FIG. 11 is a plan view showing a unit mask included in a probe assembly according to an exemplary embodiment.
Figure 12:
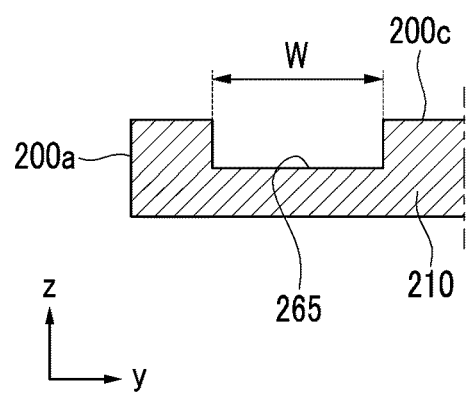
FIG. 12 is a cross-sectional view taken along line XII-XII of FIG. 11.

As shown in FIG. 11 and FIG. 12, the unit mask 205 includes unit mask main body part 210, the pattern opening parts 220, the first grooves 230, the second grooves 240, the third grooves 250 and the dummy pattern 265. The dummy pattern 265 has a deformed width W on the surface 200c of the unit mask 205 according to the strength of the tensile force applied to the pattern opening part 220 neighboring to the dummy pattern 265.

The dummy pattern 265 is disposed between the outermost pattern opening part 220 and the end 200a of the unit mask 205 and is formed to be depressed from the surface of the unit mask 205. The dummy pattern 265 has an oval shape on the surface 200c of the unit mask 205, such that it has a deformed width W on the surface 200c of the unit mask 205.

The deformed width W of the dummy pattern 265 is deformed according to the strength of tensile force applied to the pattern opening part 220 neighboring to the dummy pattern 265 by tensile force applied to the unit mask 205. As shown in FIG. 11, when the pattern opening part 220 has a quadrangular shape on the surface 200c of the unit mask 205, the width W of the dummy pattern 265 corresponding to one side 221 of the pattern opening part 220 is gradually narrowed from a portion corresponding to the central portion of one side of the pattern opening part 220 to the outer portion of one side 221 of the pattern opening part 220.

In other words, in the entire portion of one side 221 of the pattern opening part 220, the width W of the dummy pattern 265 corresponding to one portion to which a stronger tensile force is applied than other portions is formed to be wider than the width W of the dummy pattern 265 corresponding to other portions of the pattern opening part 220.

In this configuration, the dummy pattern 265 has the deformed width W on the surface 200c of the unit mask 205 according to the strength of the tensile force applied to the pattern opening part 220, thereby dispersing the tensile force applied to the pattern opening part 220.

Further, the tensile force applied to the pattern opening part 220 is dispersed by the dummy pattern 265, such that the deformation of the pattern opening part 220 by the tensile force applied to the unit mask 205 is suppressed.

In the dummy pattern 265 of the unit mask 205, the width W corresponding to one portion to which a stronger tensile force is applied than other portions in the entire portion of one side 221 of the pattern opening part 220 is formed to be wider than the width W corresponding to other portions of one side 221. However, the width W corresponding to one portion to which a stronger tensile force is applied than other portions in the entire portion of one side 221 of the pattern opening part 220 can be formed to be narrower than the width W corresponding to other portions of one side 221 in other embodiments.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:
1. A mask assembly comprising:
a frame having an opening; and
a plurality of unit masks over the opening, each of the unit masks having both ends supported by the frame in a state where tensile force is applied in opposite directions along one axis, each of the unit masks comprising:
pattern openings arranged along the one axis; and
a first groove adjacent to, and spaced from the pattern openings, and between the pattern openings and an edge of the unit mask, the first groove having at least two sidewalls and a bottom wall enclosing an end of the first groove with the at least two sidewalls, the first groove being recessed at a surface of the unit mask.

2. The mask assembly of claim 1, wherein the first groove has a deformed width on the surface of the unit mask according to a strength of the tensile force applied to the pattern openings adjacent the first groove.

3. The mask assembly of claim 2, wherein the first groove has a semi-circular shape on the surface of the unit mask.

4. The mask assembly of claim 2, wherein the unit mask further comprises a second groove adjacent the pattern openings and between neighboring ones of the pattern openings, the second groove being recessed at the surface of the unit mask.

5. The mask assembly of claim 4, wherein the second groove has a deformed width on the surface of the unit mask according to the strength of the tensile force applied to the pattern openings adjacent the second groove.

6. The mask assembly of claim 5, wherein the second groove has a semi-circular shape or a cone shape on the surface of the unit mask.

7. The mask assembly of claim 4, wherein the first groove comprises a plurality of first grooves, and
wherein the unit mask further comprises a third groove between neighboring ones of the first grooves and recessed at the surface of the unit mask.

8. The mask assembly of claim 7, wherein the third groove has a polygonal shape.

9. The mask assembly of claim 4, wherein the unit mask further comprises a dummy pattern between outermost ones of the pattern openings and respective ends of the unit mask.

10. The mask assembly of claim 9, wherein the dummy pattern has a deformed width on the surface of the unit mask according to the strength of the tensile force applied to the pattern openings adjacent the dummy pattern.

11. The mask assembly of claim 9, wherein the dummy pattern penetrates through the unit mask.

12. The mask assembly of claim 9, wherein the dummy pattern is recessed at the surface of the unit mask.

13. The mask assembly of claim 9, wherein the dummy pattern is overlapped with the frame.

14. The mask assembly of claim 1, wherein the pattern openings are stripe or dot type pattern openings.

15. A unit mask having a first end and a second end opposite each other, the unit mask being supported by a frame in a state where tensile force is applied in opposite directions along one axis, the unit mask comprising:
a main body having a band shape extending along the one axis;
pattern openings arranged along the one axis; and
a first groove adjacent to, and spaced from the pattern openings and between the pattern openings and an edge of the main body, the first groove having at least two sidewalls and a bottom wall enclosing an end of the first groove with the at least two sidewalls, the first groove being recessed at a surface of the main body.

16. The unit mask of claim 15, wherein the first groove has a deformed width on the surface of the main body according to a strength of the tensile force applied to one of the pattern openings adjacent the first groove.

17. The unit mask of claim 16, further comprising a second groove adjacent the pattern openings and between two adjacent neighboring ones of the pattern openings, and recessed at the surface of the main body.

18. The unit mask of claim 17, wherein the second groove has a deformed width on the surface of the main body according to the strength of the tensile force applied to one of the pattern openings adjacent the second groove.

19. The unit mask of claim 18, further comprising a third groove between adjacent neighboring ones of the first grooves and recessed at the surface of the main body,
wherein the first groove is plural in number.

20. The unit mask of claim 19, further comprising a dummy pattern between outermost ones of the pattern openings and respective ends of the main body.

21. The unit mask of claim 20, wherein the dummy pattern has a deformed width on the surface of the main body according to the strength of the tensile force applied to one of the pattern openings neighboring the dummy pattern.

22. The unit mask of claim 15, wherein the pattern openings are stripe or dot type pattern openings.

* * * * *